US008170505B2

(12) United States Patent
Keerti et al.

(10) Patent No.: US 8,170,505 B2
(45) Date of Patent: May 1, 2012

(54) DRIVER AMPLIFIER HAVING A PROGRAMMABLE OUTPUT IMPEDANCE ADJUSTMENT CIRCUIT

(75) Inventors: Arvind Keerti, Santa Clara, CA (US); Jin-Su Ko, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 944 days.

(21) Appl. No.: 12/182,403

(22) Filed: Jul. 30, 2008

(65) Prior Publication Data
US 2010/0026393 A1    Feb. 4, 2010

(51) Int. Cl.
H03C 1/52    (2006.01)
H03F 3/14    (2006.01)
(52) U.S. Cl. .................. 455/107; 455/115.1; 330/302
(58) Field of Classification Search .............. 455/107, 455/248.1, 323, 341, 311, 127.3, 194.2, 115.1; 330/302, 277, 307, 69, 124 R
See application file for complete search history.

(56) References Cited

U.S. PATENT DOCUMENTS

| 4,806,944 | A | | 2/1989 | Jacomb-Hood |
| 5,134,311 | A | * | 7/1992 | Biber et al. .................. 327/108 |
| 5,276,912 | A | | 1/1994 | Siwiak et al. |
| 6,195,536 | B1 | | 2/2001 | Peckham et al. |
| 6,801,621 | B1 | * | 10/2004 | Tennen et al. ................. 379/345 |
| 6,965,837 | B2 | | 11/2005 | Vintola |
| 7,113,033 | B2 | * | 9/2006 | Barnett ......................... 330/129 |
| 7,453,321 | B2 | | 11/2008 | Itkin et al. |
| 7,592,961 | B2 | * | 9/2009 | Thober et al. ................. 343/745 |
| 8,072,272 | B2 | * | 12/2011 | Zhao et al. ..................... 330/310 |

FOREIGN PATENT DOCUMENTS

| WO | WO02082637 A1 | 10/2002 |
| WO | WO2004034569 | 4/2004 |
| WO | WO2006121650 | 11/2006 |
| WO | WO2007142568 | 12/2007 |

OTHER PUBLICATIONS

International Search Report & Written Opinion—PCT/US2009/052243, International Search Authority—European Patent Office—Dec. 22, 2009.
Partial International Search Report—PCT/US2009/052243, International Search Authority—European Patent Office—Oct. 19, 2009.

* cited by examiner

*Primary Examiner* — Sonny Trinh
(74) *Attorney, Agent, or Firm* — Kevin T. Cheatham

(57) ABSTRACT

A driver amplifier in an integrated circuit is suitable for driving a signal onto an output node and through an output terminal, and through a matching network to a power amplifier. A novel Programmable Output Impedance Adjustment Circuit (POIAC) within the integrated circuit is coupled to the output node and affects an output impedance looking into the output terminal. When the output impedance would otherwise change (for example, due to a driver amplifier power gain change), the POIAC adjusts how it loads the output node such that the output impedance remains substantially constant. The POIAC uses a series-connected inductor and capacitor L-C-R circuit to load the output node, thereby reducing the amount of capacitance and die area required to perform multi-band impedance matching with a power amplifier. Multi-band operation is accomplished by changing an effective capacitance in the L-C-R circuit depending on communication band information received by the POIAC.

30 Claims, 7 Drawing Sheets

L-C-R SHUNT CIRCUIT
(EMBODIMENT #1)

OUTPUT VSWR OF NOVEL DA WITH NOVEL
PROGRAMMABLE OUTPUT IMPEDANCE
ADJUSTMENT CIRCUIT

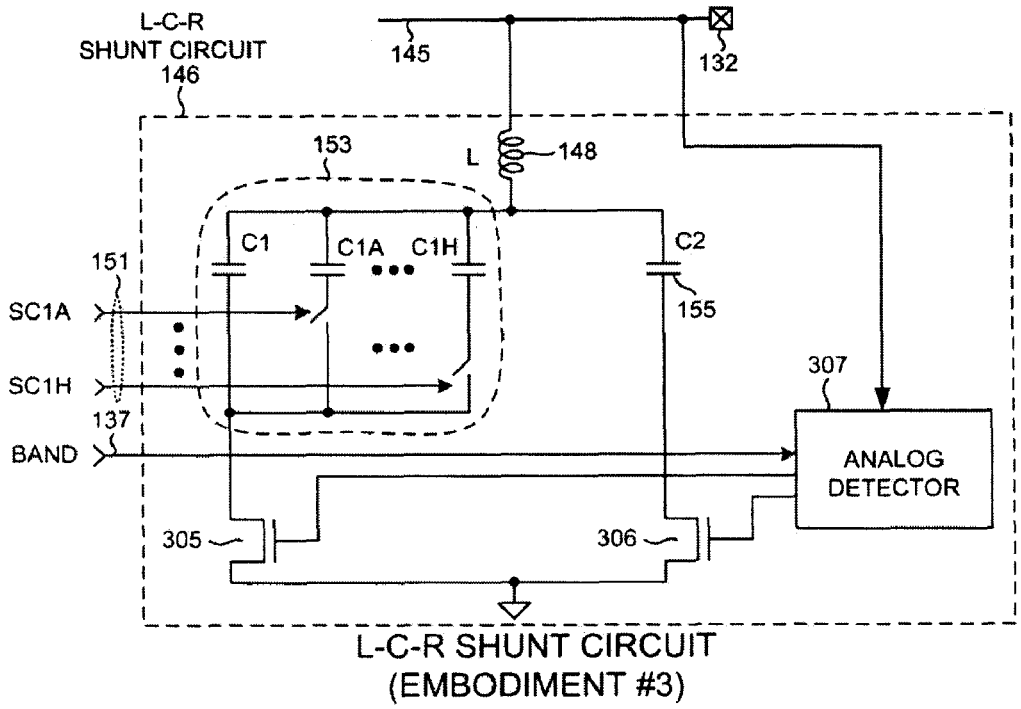

FIG. 11

- 501: PROVIDING AN L-C-R SHUNT CIRCUIT BETWEEN A DRIVER AMPLIFIER OUTPUT NODE AND A GROUND NODE. WHEN THE INDUCTANCE L OF THE INDUCTOR IS IN UNITS OF HENRYS, AND WHEN THE EFFECTIVE CAPACITANCE C IS IN UNITS OF FARADS, THE RATIO L/C IS GREATER THAN FIFTY.

- 502: AS THE POWER GAIN OF THE DRIVER AMPLIFIER CHANGES, ADJUSTING THE RESISTANCE R OF THE L-C-R SHUNT CIRCUIT SUCH THAT THE OUTPUT IMPEDANCE ON THE OUTPUT NODE REMAINS CONSTANT, AND SUCH THAT IMPEDANCE MATCHING AT THE POWER AMPLIFIER INPUT IS MAINTAINED.

- 503: AS THE COMMUNICATION FREQUENCY BAND CHANGES, ADJUSTING THE EFFECTIVE CAPACITANCE C OF THE L-C-R SHUNT CIRCUIT SUCH THAT THE OUTPUT IMPEDANCE ON THE OUTPUT NODE REMAINS CONSTANT, AND SUCH THAT IMPEDANCE MATCHING AT THE POWER AMPLIFIER INPUT IS MAINTAINED.

FIG. 12

US 8,170,505 B2

DRIVER AMPLIFIER HAVING A PROGRAMMABLE OUTPUT IMPEDANCE ADJUSTMENT CIRCUIT

BACKGROUND INFORMATION

1. Technical Field

The disclosed embodiments relate to amplifiers and impedance matching.

2. Background Information

In radio transmitters of mobile communication devices such as cellular telephones, a driver amplifier on a first integrated circuit is often made to drive a power amplifier on another integrated circuit. The power amplifier in turn drives an antenna such that a radio frequency signal is radiated from the antenna.

FIG. 1 (Prior Art) is a block diagram of a typical circuit. Driver amplifier 1 is a part of a first integrated circuit 2. The particular driver amplifier illustrated includes two stages 3 and 4. Each stage includes a plurality of cells. If the driver amplifier is amplify with more power gain, then more cells of each stage are enabled. If the driver amplifier is to amplify with less power gain, then fewer cells of each stage are enabled. The driver amplifier supplies the output signal onto an output terminal 5, and through a matching network 6 of discrete components, and to an input terminal 7 of a second integrated circuit 8. Second integrated circuit 8 includes a power amplifier 9 that receives the signal from input terminal 7, amplifies the signal, and outputs an amplified version of the signal onto output terminal 10 and to antenna 11. To achieve low distortion and optimal power transfer, the output impedance of driver amplifier 1 should be such that impedance matching occurs at terminal 7 at the input of the power amplifier. Commercially available power amplifier integrated circuits may, for example, have relatively constant input impedances of fifty ohms over the frequency band of the signals being amplified. Unfortunately, as the power of the driver amplifier is decreased due to using fewer and fewer cells in the driver amplifier, the output impedance of the driver amplifier changes. In such a situation, the output impedance looking into terminal 5 may increase or decrease depending on a number of factors. Regardless of whether the output impedance increases or decreases, the change in output impedance may lead to an undesirable impedance mismatch at terminal 7, and hence may lead to distortion in the amplifier.

FIG. 2 (Prior Art) is a chart that illustrates an example of how the impedance matching at terminal 7 may change depending on the number of cells used in the driver amplifier. The cells in the two stages of driver amplifier 1 are identified in FIG. 1 with reference numerals 13 and 14. The horizontal scale from one to sixteen represents the number of the sixteen cells 14 that are enabled and used in the second stage 4 of driver amplifier 1. The quantity VSWR (Voltage Standing Wave Ratio) on the vertical axis of FIG. 2 is considered a measure of mismatch. The VSWR at terminal 7 should be 2:1 or less, yet at low power levels the VSWR is much higher. This is undesirable and may result in undesirable distortion being introduced into the signal output onto antenna 11.

FIG. 3 (Prior Art) is a diagram of a circuit employed to address the problem illustrated in FIG. 2. The circuit includes a programmable matching network 15. Programmable matching network 15 is usable to change the output impedance of the driver amplifier 1 (the impedance looking into output terminal 5). As an example, for operating frequencies in the range of 1.5 to 2.0 gigahertz, capacitor 16 may have a capacitance of tens of picofarads. As the power gain of the driver amplifier changes and the number of cells used changes, the resistance of variable resistor 17 is changed to maintain a substantially constant impedance looking back from terminal 7. The impedance mismatch at terminal 7 of FIG. 2 between the driver amplifier and the power amplifier is reduced or eliminated. Unfortunately, the circuit of FIG. 3 may only be suitable for operation for signals in a single frequency band. It may, however, be required that the mobile communication device of which the transmitter is a part be operable in multiple frequency bands.

FIG. 4 (Prior Art) is a diagram of a circuit topology usable in applications in which the transmitter is to be operable in multiple frequency bands. Two separate driver amplifier/matching network/power amplifier chains 18 and 19 are employed. One chain is impedance matched for operation at frequencies of the first frequency band, whereas the other chain is impedance matched for operation at frequencies of the second frequency band. An output multiplexer 20 is provided to couple the antenna 11 to the output of the appropriate chain. The circuit of FIG. 4 is, however, undesirably large and expensive in that two separate sets of driver amplifiers and matching networks and power amplifiers are used.

FIG. 5 (Prior Art) is a diagram of a circuit operable in multiple frequency bands that does not suffer from the redundant circuitry of the circuit of FIG. 4. The matching network 21 that is coupled to output node 12 of driver amplifier 1 actually involves two capacitor and resistor impedance matching circuits 22 and 23. The appropriate one of the impedance matching circuits for the frequency band of operation is coupled to the output of driver amplifier 1 by opening and closing the appropriate ones of switches 24 and 25. Each of the capacitors 26 and 27 of matching network 21 may, for example, be large and may have a capacitance in the tens of picofarads. A considerable amount of die space may be consumed realizing these capacitors. For example, if the circuit of FIG. 5 is to be operable to amplify either a 2.0 gigahertz signal in a first frequency band (2.0 gigahertz plus or minus fifty megahertz) or a 1.5 gigahertz signal in a second frequency band (1.5 gigahertz plus or minus fifty megahertz), then capacitors 26 and 27 may have capacitances of approximately thirty picofarads and twelve picofarads.

SUMMARY

A driver amplifier in a first integrated circuit (for example, an RF transceiver integrated circuit) is suitable for driving an RF signal onto an output node and through an output terminal of the first integrated circuit, and through a matching network, and onto an input terminal of a second integrated circuit. A power amplifier in the second integrated circuit supplies an amplified version of the signal to an antenna for transmission. This type of system may, for example, be embodied in a cellular telephone.

A novel Programmable Output Impedance Adjustment Circuit (POIAC) is provided within the first integrated circuit. The POIAC is coupled to the output node and affects the output impedance looking into the output terminal of the first integrated circuit. When the output impedance looking into the output terminal would otherwise have changed (for example, due to a driver amplifier power gain change), the POIAC adjusts how it loads the output node such that the overall output impedance looking into the output terminal remains substantially constant and such that good impedance matching at the input of the power amplifier is maintained. The POIAC involves an L-C-R shunt circuit involving a series-connected inductor and capacitance, thereby reducing the amount of capacitance required to perform the impedance matching function and thereby reducing die area. The POIAC performs its impedance matching function in multiple different communication frequency bands at least in part by changing the effective capacitance of the L-C-R shunt circuit.

In some embodiments, the POIAC receives information indicative of a driver amplifier power gain setting. The POIAC uses this information to adjust a resistance within the L-C-R shunt circuit so that the POIAC loading on the output node is such that the overall output impedance looking into the output terminal between the power amplifier and the driver amplifier remains substantially constant despite driver amplifier power gain changes. In some embodiments, the POIAC receives information indicative of communication frequency band and uses this information to adjust the effective capacitance in the L-C-R shunt circuit. Different amounts of capacitance are employed for different communication frequency bands. The inductor and the relatively small capacitance of the L-C-R shunt circuit can be realized in a relatively small amount of die area as compared to conventional multi-band output impedance adjustment techniques and circuits.

In some embodiments, the POIAC receives process corner information from a process detect circuit. A capacitance-tuner circuit within the L-C-R shunt circuit uses the process corner information to fine tune the effective capacitance in series with the inductor to compensate for changes in driver amplifier output characteristics that are known to coincide with different process corner conditions. Multiple ways of realizing a POIAC are disclosed. In some examples, a processor in a digital baseband integrated circuit executes a set of processor-executable instructions. This execution causes digital information to be communicated across a bus and to the POIAC in the first integrated circuit (an RF transceiver integrated circuit). The digital information may, for example, include power setting information and/or communication frequency band information. The POIAC uses the digital information to control the L-C-R shunt circuit such that good impedance matching is maintained in different operating conditions and situations.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 11 is a diagram of a third embodiment of L-C-R shunt circuit 146 of FIG. 8.

FIG. 12 is a flowchart of a method 500 in accordance with one novel aspect.

DETAILED DESCRIPTION

Figure 6:
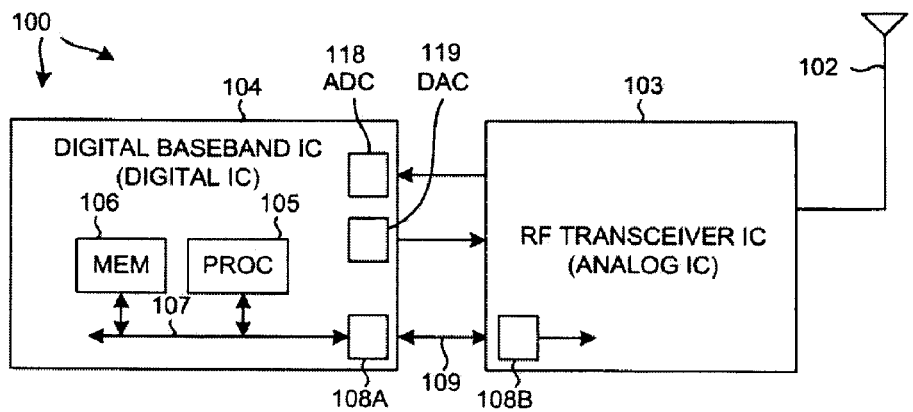
FIG. 6 is a high level block diagram of a mobile communication device in accordance with one novel aspect.

FIG. 6 is a very simplified high level block diagram of one particular type of mobile communication device 100 in accordance with one novel aspect. In this particular example, mobile communication device 100 is a 3G cellular telephone capable of operating in accordance with either a Code Division Multiple Access (CDMA) cellular telephone communication protocol or a GSM (Global System for Mobile Communications) cellular telephone communication protocol. The cellular telephone includes (among several other parts not illustrated) an antenna 102 and two integrated circuits 103 and 104. Integrated circuit 104 is called a "digital baseband integrated circuit" or a "baseband processor integrated circuit". Digital baseband integrated circuit 104 includes, among other parts not illustrated, a digital processor 105 that executes instructions stored in a processor-readable medium 106. Processor 105 can cause information to be communicated across bus 107 and bus interface 108A and bus conductors 109 and to bus interface 108B of integrated circuit 103. Integrated circuit 103 is an RF transceiver integrated circuit. RF transceiver integrated circuit 103 is called a "transceiver" because it includes a transmitter as well as a receiver.

Figure 7:
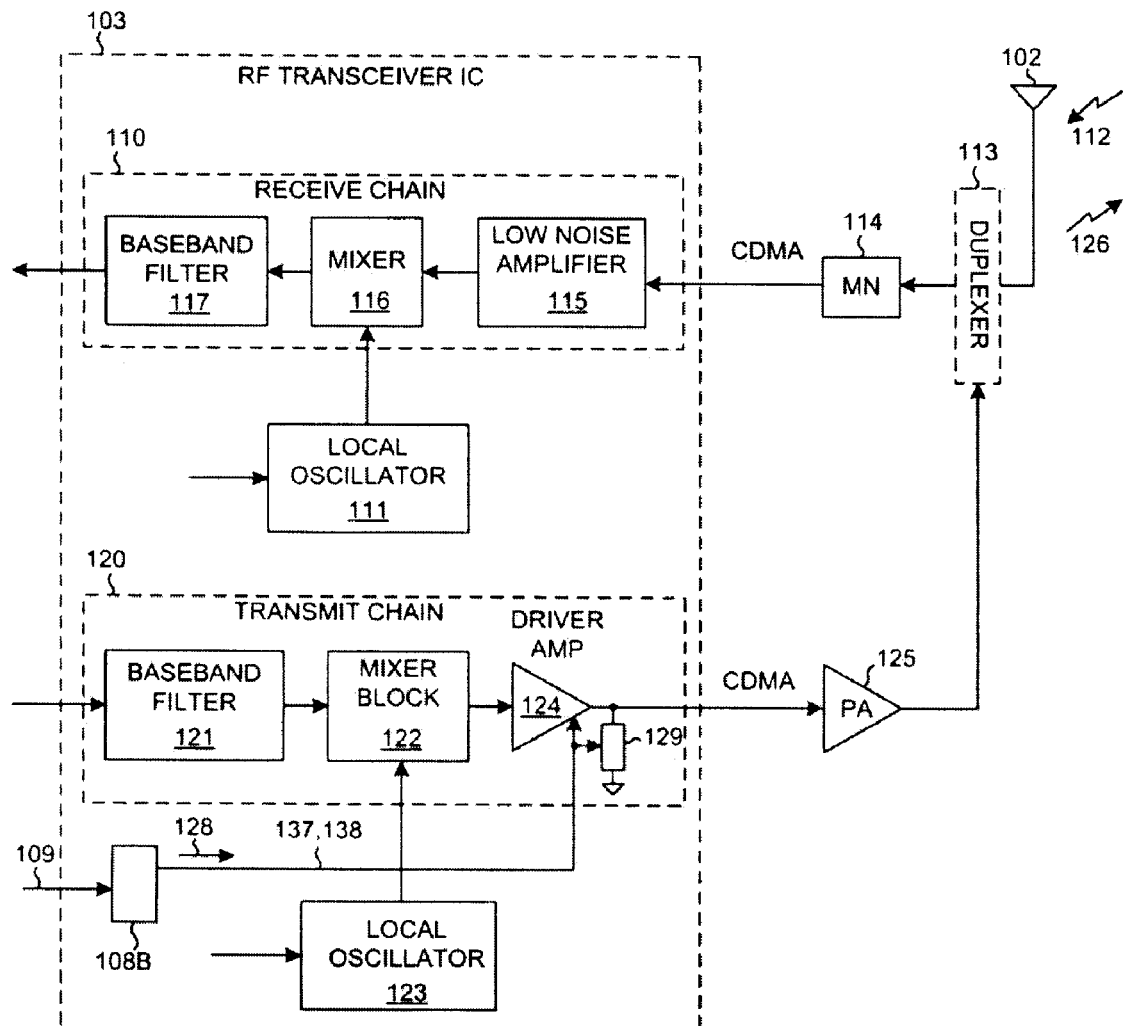
FIG. 7 is a more detailed block diagram of the RF transceiver integrated circuit 103 of FIG. 6.

FIG. 7 is a more detailed block diagram of the RF transceiver integrated circuit 103 of FIG. 6. The receiver includes what is called a "receive chain" 110 as well as a local oscillator 111. When the cellular telephone is receiving, a high frequency RF signal 112 is received on antenna 102. Information from signal 112 passes through duplexer 113, matching network 114, and through the receive chain 110. Signal 112 is amplified by low noise amplifier (LNA) 115 and is down-converted in frequency by mixer 116. The resulting down-converted signal is filtered by baseband filter 117 and is passed to the digital baseband integrated circuit 104. An analog-to-digital converter 118 in the digital baseband integrated circuit 104 converts the signal into digital form and the resulting digital information is processed by digital circuitry in the digital baseband integrated circuit 104. The digital baseband integrated circuit 104 tunes the receiver by controlling the frequency of a local oscillator signal supplied by local oscillator 111 to mixer 116.

If the cellular telephone is transmitting, then information to be transmitted is converted into analog form by a digital-to-analog converter 119 in the digital baseband integrated circuit 104 and is supplied to a "transmit chain" 120. Baseband filter 121 filters out noise due to the digital-to-analog conversion process. Mixer block 122 under control of local oscillator 123 then up-converts the signal into a high frequency signal. Driver amplifier 124 and an external power amplifier 125 amplify the high frequency signal to drive antenna 102 so that a high frequency RF signal 126 is transmitted from antenna 102. The digital baseband integrated circuit 104 tunes the transmitter by controlling the frequency of a local oscillator signal supplied by local oscillator 123 to mixer 122. Arrow 128 represents information that is communicated from digital baseband integrated circuit 104 through bus interface 108A, across bus conductors 109, and through bus interface 108B, and to driver amplifier 124 and an associated novel Programmable Output Impedance Adjustment Circuit (POIAC) 129.

Figure 8:
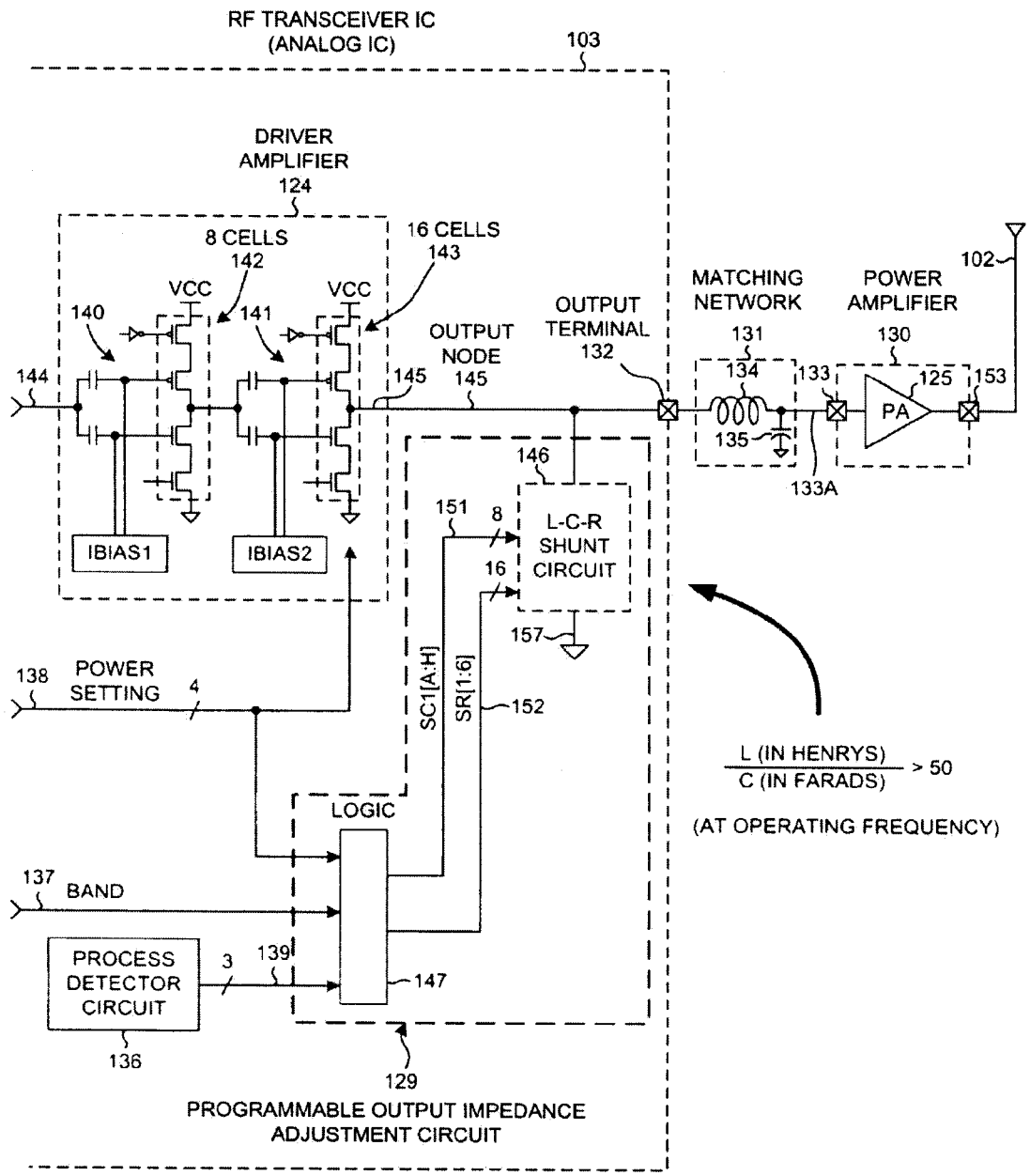
FIG. 8 is a more detailed diagram of the driver amplifier 124, POIAC 129, power amplifier 125, and antenna 102 of FIG. 7.

FIG. 8 is a more detailed diagram of the driver amplifier 124, POIAC 129, power amplifier 125, and antenna 102 of FIG. 7. Power amplifier 125 is a part of an integrated circuit 130. A matching network 131 couples an output terminal 132 of RF transceiver integrated circuit 103 to an input terminal 133 of power amplifier integrated circuit 130. Matching network 131 in this case includes discrete components mounted on a printed circuit board or other substrate. Integrated circuits 103 and 130 are also mounted to this printed circuit board or substrate. The discrete components include an inductor 134 and a capacitor 135.

The portion of RF transceiver integrated circuit 103 pictured in FIG. 8 includes driver amplifier 124, POIAC 129, a process detector circuit 136, a conductor 137 over which communication frequency band information is communicated, and a set of conductors 138 over which power setting information is communicated. Conductors 137 and 138 of FIG. 8 represent the signal conductors extending from bus interface 108B (see FIG. 7) across which the information 128 passes. The process detector circuit (sometimes referred to as a "process monitor" or a "process variation detector" or a "process variation monitor") supplies a process detector output value across conductors 139 to POIAC 129. This value is an indication of a performance characteristic or characteristics of the integrated circuit 103. In one example, the value indicates whether a propagation speed through a specified type of logic element is relatively fast ("FF"), is typical ("TT"), or is relatively slow ("SS") as compared to the propagation delays through other identical logic elements in other units of the integrated circuit manufactured using the same semiconductor fabrication process. In another example, the value indicates whether the gain of an analog amplifier is high ("H"), is nominal ("N"), or is low ("L").

Driver amplifier 124 has a power gain control range of approximately 30 dB. Driver amplifier 124 includes a first stage 140 and a second stage 141. The first stage includes eight identical cells 142. The second stage includes sixteen identical cells 143. Driver amplifier 124 amplifies a signal received on its input node 144 and outputs the resulting signal onto its output node 145. The power gain of driver amplifier 124 is controlled by enabling or disabling more of fewer of the cells in the stages. Using more of the cells results in a larger power gain, whereas using fewer of the cells results in a smaller power gain. Which ones of the cells are enabled and disabled is determined by the four-bit power setting value received on conductors 138.

Programmable output impedance adjustment circuit (POIAC) 129 includes an L-C-R shunt circuit 146 and an amount of logic 147. L-C-R shunt circuit 146 includes an inductor, an amount of capacitance, and an amount of resistance. The L-C-R circuit 146 is digitally controllable such that the inductor can resonate with a first amount of series-connected capacitance, or such that the inductor can resonate with a second amount of series-connected capacitance. The resistance provides shunting of the output node 145 to ground at resonance. The amount of resistance is digitally controllable and is adjusted to compensate for changes in output impedance of driver amplifier 124 as the power gain of driver amplifier 124 is changed.

Figure 9A:
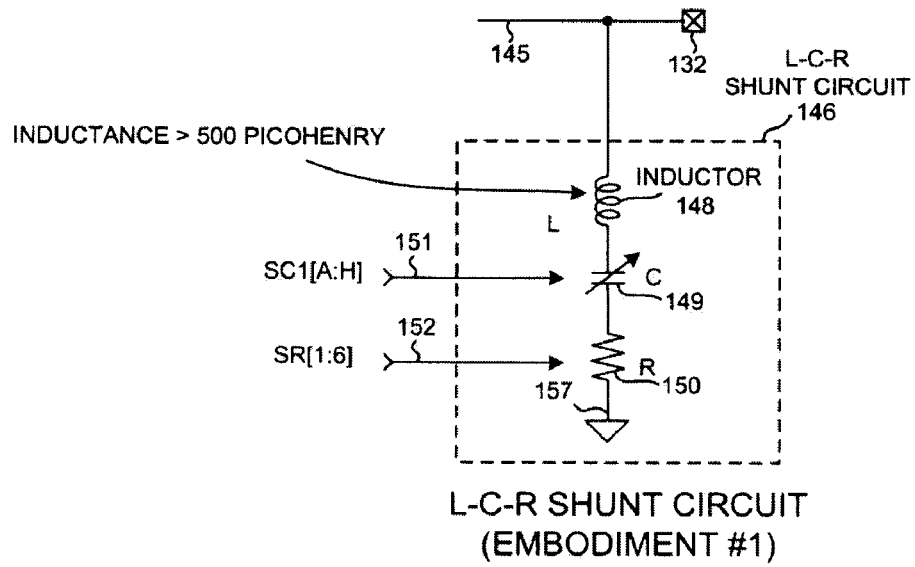
FIG. 9A is a diagram of a first embodiment of the L-C-R shunt circuit 146 of FIG. 8.

FIG. 9A illustrates a first way that L-C-R shunt circuit 146 can be realized. A relatively low Q (for example, 5) inductor 148, a digitally-controllable capacitor 149, and a digitally-controllable resistor 150 are coupled together in series between driver amplifier output node 145 and a ground node 157 as illustrated. Inductor L in the illustrated example is an integrated inductor that has a fixed inductance L of one nanohenry. The eight-bit multi-bit digital value SC1[A:H] on conductors 151 determines the capacitance C of capacitor 149. Capacitance C is tunable over the range of from six picofarads to eight picofarads. The six-bit multi-bit digital value SR[1:6] on conductors 152 determines the resistance R of resistor 150. Resistance R is tunable. In one novel aspect, the ratio of L/C, when the inductance L is considered in units of henrys and when the capacitance of C is considered in units of farads, is more than fifty. The inductance is greater than 500 picohenries.

Figure 9B:
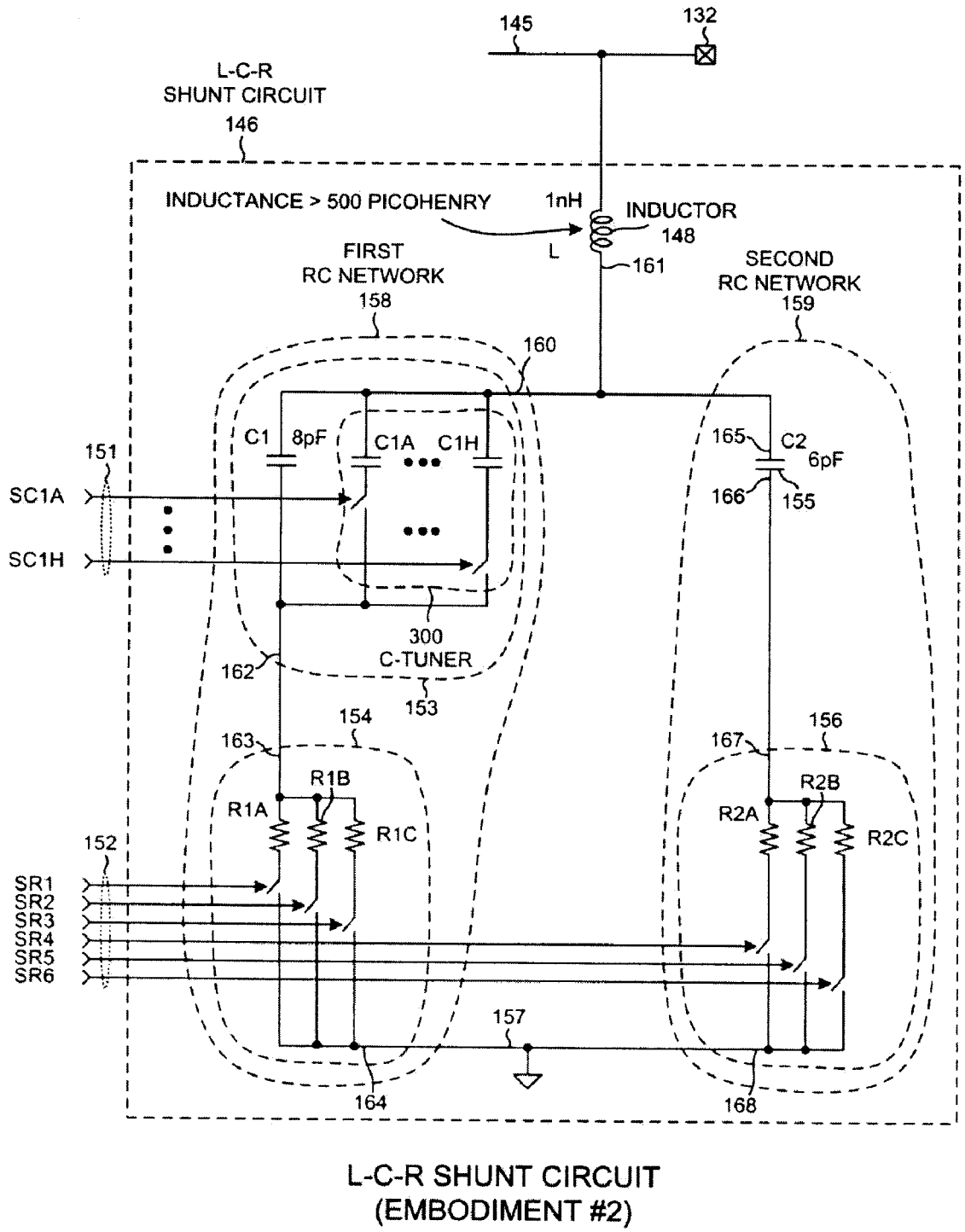
FIG. 9B is a diagram of a second embodiment of the L-C-R shunt circuit 146 of FIG. 8.

FIG. 9B illustrates a second way that L-C-R shunt circuit 146 can be realized. L-C-R shunt circuit 146 includes low Q inductor 148, a digitally-controllable first digitally-controllable capacitor 153, a first digitally-controllable first resistor 154, a second capacitor 155, and a digitally-controllable second resistor 156. If at least one of the switches controlled by signals SR1-SR3 is closed, then inductor 148, first capacitor 153, and first resistor 154 are coupled together in series between driver amplifier output node 145 and ground node 157. First capacitor 153 and first resistor 154 can be considered together to be a first RC network 158. If at least one of the switches controlled by signals SR4-SR6 is closed, then inductor 148, second capacitor 155, and second resistor 156 are coupled together in series between driver amplifier output node 145 and ground node 157. Second capacitor 155 and second digitally-controllable resistor 156 can be considered together to be a second RC network 159. The switches of FIG. 9B may, for example, be realized as N-channel field effect transistors or as the transmission gates involving an N-channel field effect transistor and a P-channel field effect transistor. The capacitance C1 is eight picofarads. The capacitance C2 is six picofarads.

The L-C-R shunt circuit 146 of FIG. 9B also includes a capacitance-tuner circuit 300. Capacitance-tuner circuit 300 includes eight capacitors and eight associated switches. Each of the eight capacitances C1A through C1H is 0.1 picofarads.

Operation of Programmable Output Impedance Adjustment Circuit of FIG. 8 is described in connection with the second embodiment of the L-C-R shunt circuit 146 of FIG. 9B in two operational situations. In the first situation, the cellular telephone signal being amplified by driver amplifier 124 has a carrier frequency in a first communication band of approximately 2.0 gigahertz. The range of the first communication band, for illustrative purposes, is 2.0 gigahertz plus or minus fifty megahertz. In the second situation, the cellular telephone signal has a carrier frequency in a second communication band of approximately 1.5 gigahertz. The range of the second communication band, for illustrative purposes, is 1.5 gigahertz plus or minus fifty megahertz.

In the first situation, none of the switches of FIG. 9B controlled by signals SR4-SR6 is closed. Capacitor 155 and the second RC network 159 is therefore effectively disabled from performing a shunting function. At least one of the switches controlled by signals SR1-SR3 is closed such that inductor 148, first capacitor 153 and first resistor 154 are series-connected between output node 145 and ground node 157. When the power setting of driver amplifier 124 is at a midrange setting (eight of the sixteen cells 143 of second stage 141 are enabled), and when the process detector 136 is outputting a value corresponding to a "typical" process, the resistance R1 of the first resistor 154 is set at its midrange setting. The overall capacitance of the first capacitor 153 is set such that programmable matching network 146 affects the impedance on output node 145 such that the impedance looking back from node 133A is approximately fifty ohms. This fifty ohms substantially matches fifty ohm input impedance looking into the input terminal 133 of power amplifier integrated circuit 130. Half of the cells of driver amplifier 124 are enabled. Driver amplifier 124 receives the 2.0 gigahertz signal on input node 144, and outputs an amplified version of the signal onto output node 145. This signal passes through matching network 131, to node 133A, and through input terminal 133 of power amplifier integrated circuit 130. Power amplifier 125 drives an amplified version of the 2.0 gigahertz signal through output terminal 153 and to antenna 102 such that the signal radiates from antenna 102.

In this first situation, as the power gain of the driver amplifier 124 is changed by increasing or decreasing the number of cells used, the resistance R1 of first resistor 154 is changed such that the L-C-R shunt circuit 146 controls the output impedance on output node 145 such that the impedance on node 133A remains at a substantially constant value and such that impedance matching to the input of power amplifier 130 is maintained. The resistances R1A, R1B and R1C are selected such that the various switched parallel combinations of these resistances result in an overall resistance R1 that can be varied sufficiently to compensate for changes in output driver amplifier output impedance due to power setting changes.

In the second situation, at least one of the switches controlled by signals SR1-SR3 is closed and at least one of the switches controlled by signals SR4-SR6 is closed such that both the first RC network 158 and the second RC network 159 (see FIG. 9B) are used. A first lead 160 of first capacitor 153 is connected to a lead 161 of inductor 148. A second lead 162 of first capacitor 153 is connected to a first lead 163 of first resistor 154. A second lead 164 of first resistor 154 is connected to ground node 157. Similarly, a first lead 165 of second capacitor 155 is connected to lead 161 of inductor 148. A second lead 166 of second capacitor 155 is connected to a first lead 167 of second resistor 156. A second lead 168 of second resistor 156 is connected to ground node 157. By coupling both the first capacitor 153 and the second capacitor 155 into the L-C-R series circuit, the effective capacitance that resonates with inductor 148 is not just the capacitance of first capacitor 153, but rather is the combined capacitances of the two capacitors 153 and 155. This increase in the amount of capacitance changes the resonant frequency from the frequency of one communication band to the frequency of a second communication band.

When the power setting of driver amplifier 124 is at its midrange setting, and when the process detector is outputting the value corresponding to a "typical" process, the resistances R1 and R2 of the first and second resistors 154 and 156 are set at their midrange settings. The 1.5 gigahertz signal input node 144 is amplified by driver amplifier 124. Driver amplifier 124 outputs an amplified version of the signal onto output node 145. The signal passes through matching network 131, to node 133A, and through input terminal 133 of power amplifier integrated circuit 130. Power amplifier 125 receives the signal and drives an amplified version of the signal through output terminal 153 and to antenna 102 such that the signal radiates from antenna 102. The overall combined capacitance is set such that L-C-R shunt circuit 146 affects the impedance on output node 145 such that the impedance looking back from node 133A is maintained at approximately fifty ohms.

In this second situation, as the power gain of the driver amplifier 124 is changed by increasing or decreasing the number of cells used, the resistances R1 and R2 are changed such that the L-C-R shunt circuit 146 adjusts the impedance on node 145 such that impedance matching at node 133A is maintained.

Figure 10:
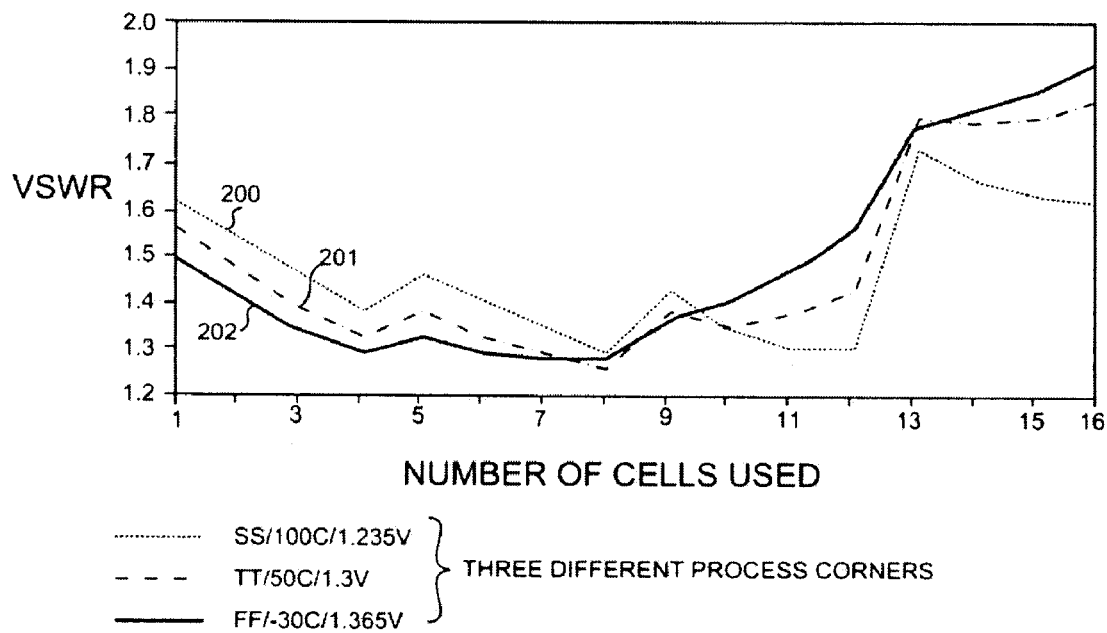
FIG. 10 is a chart that shows how VSWR on node 133 changes as a function of the number of cells used in the driver amplifier 124 of FIG. 8.

FIG. 10 is a chart that illustrates how the VSWR at node 133A of the circuit of FIGS. 8 and 9B varies with power setting. The sixteen power setting values of one through sixteen indicated on the bottom horizontal axis correspond to operation of the circuit of FIGS. 8 and 9B when the four-bit digital power setting value on conductors 138 ranges from [0000] to [1111]. When the value is [0000], one cell in second stage 141 is enabled and used. When the value is [1111], sixteen cells in second stage 141 are enabled and used. The three lines 200-202 in the chart of FIG. 10 correspond to conditions in which the three-bit process monitor output value on conductors 139 indicates: 1) a "slow process" at boundary temperature and operating voltage conditions where the circuit propagation times are the slowest, 2) a "typical process" at midrange temperature and operating voltage conditions, and 3) a "fast process" at the boundary temperature and operating voltage conditions where the circuit propagation times are the fastest. Note that the VSWR at node 133A is less than 2:1 over the full range of power settings for each of the three process corners. This chart is representative of operation in both of the two communication frequency bands (2.0 gigahertz and 1.5 gigahertz) set forth above.

Figure 1:
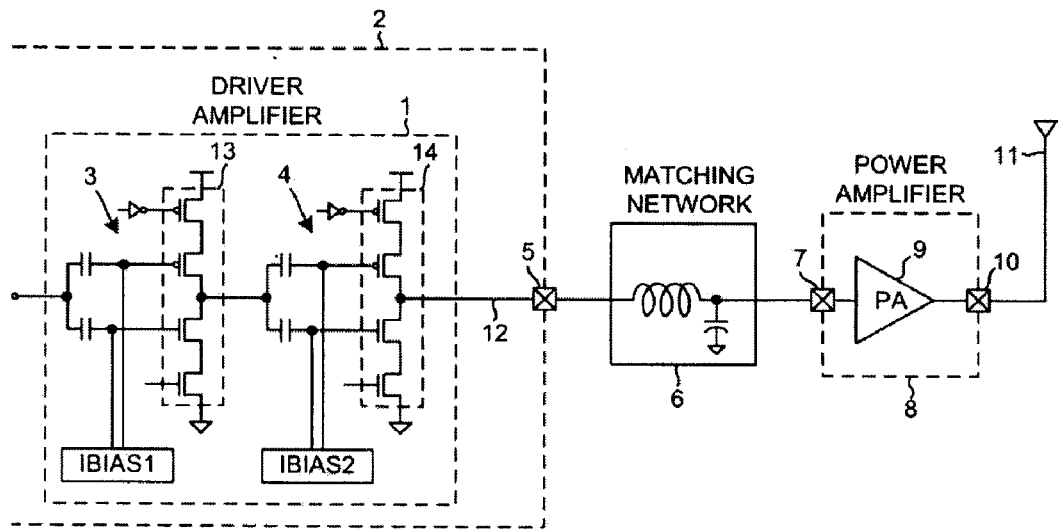
FIG. 1 (Prior Art) is a block diagram of a driver amplifier that drives a power amplifier.
Figure 2:
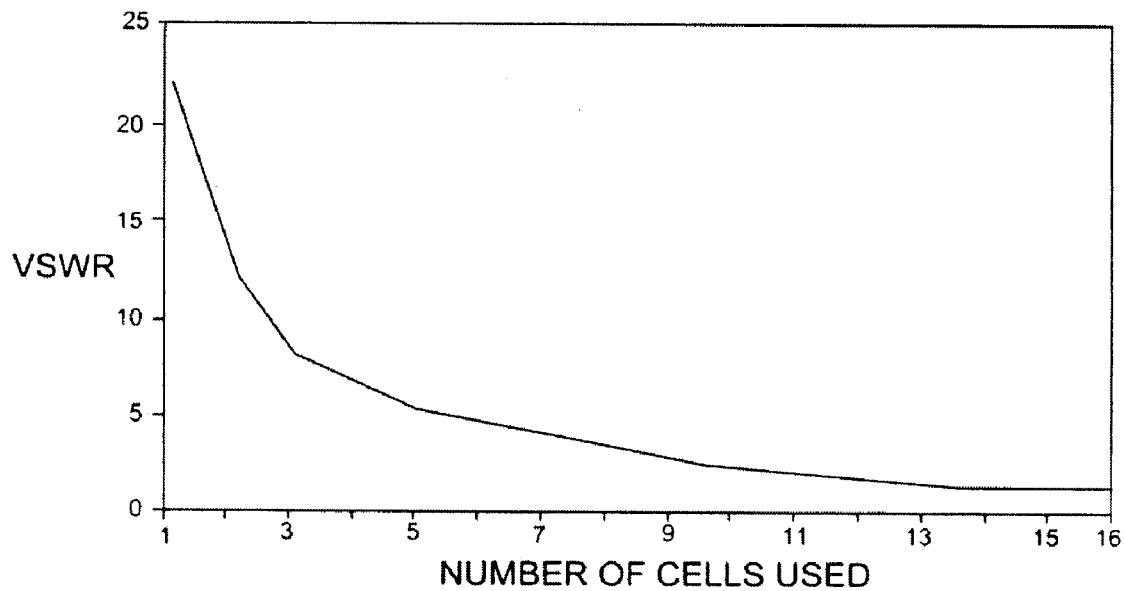
FIG. 2 (Prior Art) is a chart that illustrates an impedance matching problem associated with the driver amplifier of FIG. 1.
Figure 3:
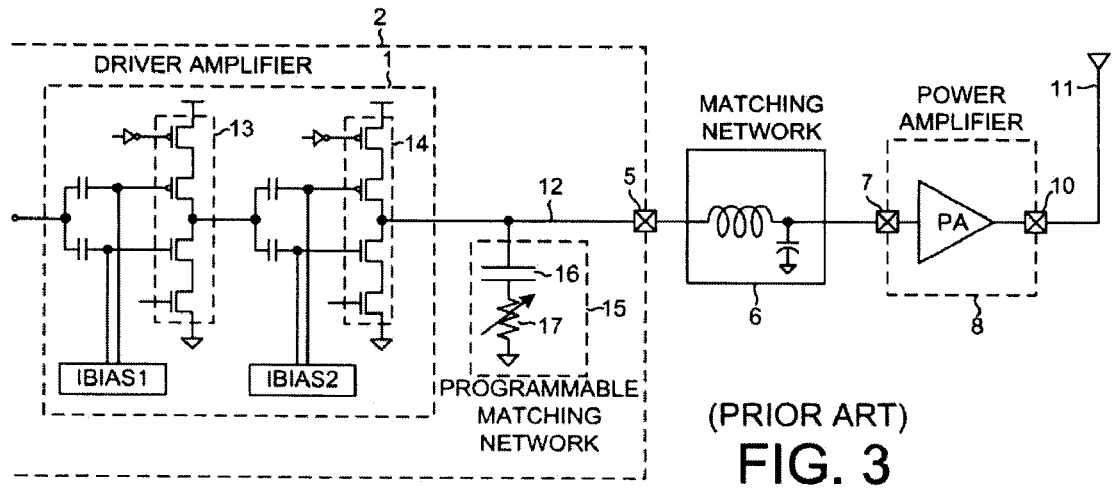
FIG. 3 (Prior Art) is a diagram of a circuit employed to address the problem illustrated in FIG. 2.
Figure 4:
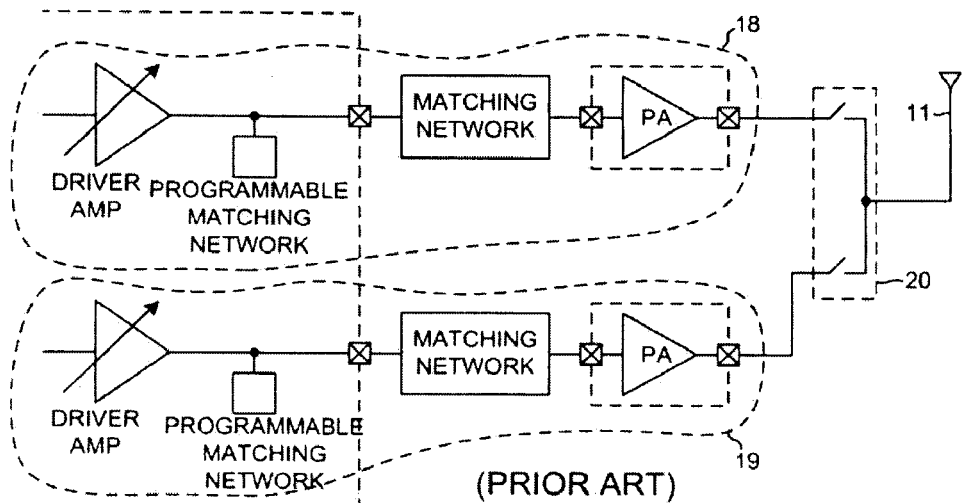
FIG. 4 (Prior Art) is a diagram of a driver amplifier circuit usable in applications in which the transmitter is to be operable in multiple frequency bands.
Figure 5:
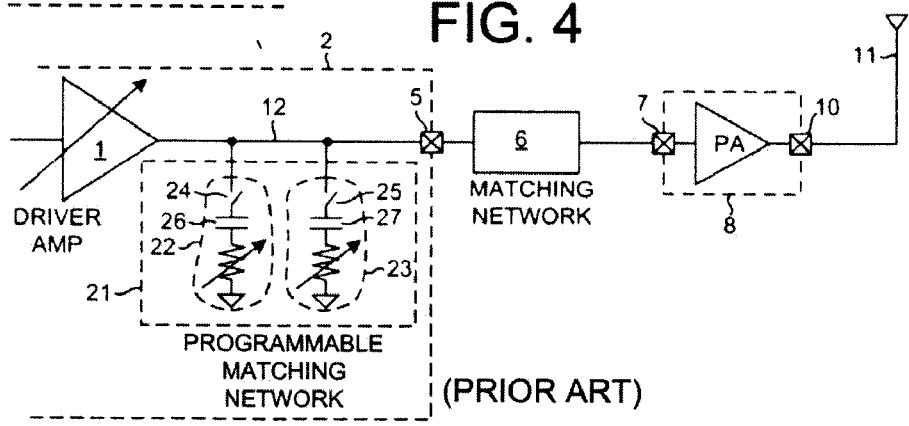
FIG. 5 (Prior Art) is a diagram of a driver amplifier circuit operable in multiple frequency bands that does not suffer from the redundant circuit problem of the circuit of FIG. 4.

In one advantageous aspect, impedance matching in multiple communication frequency bands is provided with a total capacitance that is substantially smaller than the capacitance of the capacitor 16 of the conventional circuit of FIG. 3. Assuming for comparison purposes that the driver amplifiers in FIGS. 5 and 8 are identical, and assuming for comparison purposes that identical matching networks and power amplifiers are used in the circuits of FIGS. 5 and 8, then the combined capacitance of capacitors 153 and 155 in the novel circuit of FIG. 9B in one example is approximately fourteen picofarads, whereas the capacitance of capacitor 26 in the conventional circuit of FIG. 5 is approximately thirty picofarads and the capacitor 27 in the conventional circuit of FIG. 5 is approximately twelve picofarads. The die area required to realize the forty-two picofarads of capacitance in the conventional circuit of FIG. 5 using one representative semiconductor fabrication process is approximately 180 microns by 120 microns, whereas the die area required to realize the one nanohenry inductor 148 is approximately 50 microns by 50 microns and the die are required to realize the eight picofarads of capacitance in the novel circuit of FIGS. 8 and 9B is approximately 40 microns by 25 microns. Substantial die area savings are therefore possible using the novel circuit of FIGS. 8 and 9B.

One limitation of the series resonant shunt scheme set forth here is that the impedance matching is relatively narrowband, and if the output capacitance of driver amplifier 124 varies significantly over process corners, then good impedance matching is lost and higher VSWRs result. To overcome this limitation, the novel L-C-R shunt circuit 146 of FIG. 9B includes a capacitance-tuner circuit 300. Capacitances C1A through C1H in FIG. 9B and their associated switches form this capacitance-tuner circuit. The percentage of capacitance change on node 145 over different process corners is determined, and the settings of the capacitance-tuner control signals SC1[A:H] on conductors 151 that would compensate for these capacitance changes is determined. Process detector circuit 136 outputs information indicative of the process corner in which the circuit is operating, and supplies this information to logic 147. Logic 147 uses the process corner information to adjust the capacitance-tuner control signals SC1[A:H] such that impedance changes on output node 145 that would otherwise vary as a function of process detector output value are compensated. A VSWR at node 133A below 2:1 is maintained over all process corners, in both the 2.0 gigahertz and the 1.5 gigahertz communication frequency bands.

FIG. 11 is a diagram of a third embodiment of L-C-R shunt circuit 146 of FIG. 8. Rather than using switched sets of resistors 154 and 156 as in the second embodiment of FIG. 9B, the third embodiment employs N-channel transistors 305 and 306 and an analog control loop. The source-to-drain resistances through transistors 305 and 306 are controlled by adjusting the gate-to-source voltage across the transistors 305 and 306. Analog detector 307 detects the root-mean-square (RMS) voltage or the peak voltage on output node 145. If this voltage is detected to have decreased in magnitude, then it is assumed that the signal is being unduly attenuated on output node 145 by a reduced impedance. Analog detector 307 therefore decreases the gate-to-source voltage on transistors 305 and 305, thereby reducing the source-to-drain resistances through transistors 305 and 306 and reducing the loading on output node 145 due to L-C-R shunt circuit 146. The reduction in loading due to L-C-R shunt circuit 146 serves to counteract the reduction in RMS or peak voltage on output node 145, and thereby maintains a good impedance match at node 133A.

FIG. 12 is a simplified flowchart of a method 500 in accordance with one novel aspect. In a first step (step 501), an L-C-R shunt circuit is provided between a driver amplifier output node and a ground node. In one example, the L-C-R shunt circuit is the L-C-R shunt circuit 146 of FIG. 9B. This L-C-R shunt circuit is coupled between the output node 145 of driver amplifier 124 of FIG. 8 and ground node 157. In a second step (step 502), as the power gain of the driver amplifier changes, the resistance R of the L-C-R shunt circuit is adjusted such that the output impedance on the output node remains constant. In one example, the four-bit digital power setting information on conductors 138 in FIG. 8 indicates the power gain of the driver amplifier, and this power setting value is used to set the resistance of the first resistor 154 of FIG. 9B. In a third step (step 503), as the communication frequency band changes, the effective capacitance C of the L-C-R shunt circuit is adjusted such that the output impedance on the output node remains constant. In one example, the output impedance is the same in both a first communication frequency band (2.0 gigahertz, plus or minus fifty megahertz) and a second communication frequency band (1.5 gigahertz, plus or minus fifty megahertz). The digital communication frequency band information on conductor 137 in FIG. 8 is used by logic 147 to control the switches in resistors 154 and 156 of FIG. 9B such that both capacitors 153 and 155 are used. The effective capacitance is the combined capacitance of capacitors 153 and 155. By maintaining the output impedance on output terminal 132 constant, impedance matching at node 133A at the input of the power amplifier 130 is maintained, even though the power gain of the driver amplifier 124 is changed and even though the communication frequency band is changed. The order of steps 502 and 503 can be reversed.

In one or more exemplary embodiments, the functions described may be implemented in hardware, software, firmware, or any combination thereof. If implemented in software, the functions may be stored on or transmitted over as one or more instructions or code on a computer-readable or processor-readable medium. Computer-readable and processor-readable media includes both computer storage media and communication media including any medium that facilitates transfer of a program from one place to another. A storage media may be any available media that can be accessed by a computer or processor. By way of example, and not limitation, such media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer or processor. Also, a connection may be properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave, then the connection is included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. Execution by processor 105 of a set of instructions stored in a processor-readable medium 106 of digital baseband IC 104 in some embodiments causes digital information to be communicated from digital baseband IC 104, across bus conductors 109, and to the novel POIAC 129 such that the digital information at least in part determines and/or adjusts the output impedance looking into output terminal 132.

Although certain specific embodiments are described above for instructional purposes, the teachings of this patent document have general applicability and are not limited to the specific embodiments described above. L-C-R shunt circuits having circuit topologies other than the specific topologies of the examples set forth above are possible while maintaining the above-described L/C ratio (when L is in units of henrys, and C is in units of Farads) of greater than fifty. An L-C-R shunt circuit can employ transistors and other circuit elements to provide inductances, capacitances and/or resistances within the L-C-R shunt circuit. Although an embodiment is described above involving a block of logic 147 that translates incoming digital values into control values (SC1[A:H] and SR[1:6]) that in turn control the L-C-R shunt circuit, other embodiments do not include such a block of translating logic but rather the incoming digital values (for example, power setting values and/or communication frequency band information and/or process monitor information) control the L-C-R shunt circuit directly. Although examples are set forth above in which the output impedance of a terminal is maintained constant, this is not the case in all embodiments of the novel POIAC circuit. For example, the circuit being driven may have an input impedance that is not constant. The POIAC operates to vary the output impedance looking into output terminal 132 to vary with, and to match, the varying input impedance of the driven device such that superior impedance matching is maintained despite changing in the input impedance of the driven device. Identical POIAC circuits of identical RF transceiver integrated circuits embodied in different systems may be controlled differently to accommodate driving different types of power amplifiers in the various systems. Accordingly, various modifications, adaptations, and combinations of the various features of the described specific embodiments can be practiced without departing from the scope of the claims that are set forth below.

What is claimed is:

1. An integrated circuit comprising:
a driver amplifier having an output node; and
a programmable output impedance adjustment circuit (POIAC) coupled to the output node, wherein the POIAC includes an inductor, a first capacitor, and a first resistor,
wherein the inductor and first capacitor are coupled together in series, and
wherein the POIAC is configured to affect an output impedance of the driver amplifier by digitally controlling at least one of a capacitance of the first capacitor or a resistance of the first resistor.

2. The integrated circuit of claim 1, wherein the driver amplifier is configured to supply a signal onto the output node, wherein the signal comprises a cellular telephone signal having a carrier frequency of at least 850 megahertz, wherein a ratio L/C of an inductance L of the inductor in units of henrys and the capacitance C of the first capacitor in units of farads is higher than 50.

3. The integrated circuit of claim 1, wherein the inductor has a first lead coupled to the output node, and a second lead coupled to the first capacitor.

4. The integrated circuit of claim 1, wherein the digital controlling is based on a digital logic signal received at the POIAC, wherein the digital logic signal is indicative of at least one of a plurality of driver amplifier power settings or a plurality of frequency bands.

5. The integrated circuit of claim 1, wherein the POIAC is configured to load the output node such that the output impedance on the output node remains substantially constant.

6. The integrated circuit of claim 1, wherein the POIAC is configured to receive a process detector output value indicative of a performance characteristic of the integrated circuit.

7. The integrated circuit of claim 1, further comprising:
a bus interface configured to receive digital information onto the integrated circuit,
wherein the digital information is communicated within the integrated circuit from the bus interface to the POIAC.

8. The integrated circuit of claim 7, wherein the digital information includes power setting information and communication frequency band information of the driver amplifier.

9. An integrated circuit, comprising:
a driver amplifier having an output node; and
a programmable output impedance adjustment circuit (POIAC) coupled to the output node, wherein the POIAC includes an inductor, a first capacitor, and a first resistor,
wherein the inductor has an inductance of L in units of henrys,
wherein the first capacitor has a capacitance of C in units of farads,
wherein the ratio of L/C is more than fifty, and
wherein the inductor, the first capacitor and the first resistor are coupled together in series between a lead of the inductor and a ground node.

10. The integrated circuit of claim 9, wherein a capacitance of the first capacitor and a resistance of the first resistor are digitally controlled.

11. An integrated circuit, comprising:
a driver amplifier having an output node; and
a programmable output impedance adjustment circuit (POIAC) coupled to the output node, wherein the POIAC includes:
an inductor and a first capacitor coupled together in series, a first resistor, and
a second capacitor and a second resistor,
wherein the second capacitor and the second resistor are coupled together in series between a lead of the inductor and a ground node, and
wherein the first capacitor and the first resistor are coupled together in series between the lead of the inductor and the ground node.

12. The integrated circuit of claim 11, wherein the second capacitor has a digitally-controlled capacitance, and wherein the second resistor has a digitally-controlled resistance.

13. An integrated circuit of claim 1, comprising:
a driver amplifier having an output node; and
a programmable output impedance adjustment circuit (POIAC) coupled to the output node, wherein the POIAC includes:
an inductor and a first capacitor coupled together in series, a first resistor, and a second capacitor,
wherein the POIAC is operable in a first mode in which the inductor and the first capacitor resonate together but in which the inductor does not resonate with the second capacitor,
and wherein the POIAC is operable in a second mode in which the inductor and the first capacitor and the second capacitor resonate together.

14. The integrated circuit of claim 13, wherein the POIAC is configured to receive a digital logic signal, and wherein the digital logic signal determines whether the POIAC operates in the first mode or the second mode.

15. An integrated circuit, comprising:
a driver amplifier having an output node; and
a programmable output impedance adjustment circuit (POIAC) coupled to the output node, wherein the POIAC includes:
an inductor and a first capacitor coupled together in series, a first resistor,
wherein the POIAC is configured to receive a multi-bit digital value that determines a capacitance C of the first capacitor and a resistance R of the first resistor.

16. A system comprising:
a first integrated circuit that includes:
an input terminal; and
a power amplifier coupled to the input terminal;
a second integrated circuit that includes:
a driver amplifier;
an output terminal; and
a programmable output impedance adjustment circuit (POIAC),
wherein the POIAC is coupled to an output node of the driver amplifier,
wherein the driver amplifier is coupled to supply a signal onto the output node and onto the output terminal,
wherein the POIAC includes:
an inductor;
a first capacitor; and
a first resistor,
wherein the inductor and first capacitor are coupled together in series,
wherein the inductor has an inductance of L in units of henrys,
wherein the first capacitor has a capacitance of C in units of farads, and
wherein the ratio of L/C is more than fifty; and
an impedance matching network that couples the output terminal of the second integrated circuit to the input terminal of the first integrated circuit.

17. The system of claim 16, wherein the C is digitally-controlled, and wherein the first resistor is a digitally-controlled variable resistor.

18. The system of claim 16, wherein the POIAC further includes:
a second capacitor; and
a second resistor,
wherein the second capacitor and the second resistor are coupled together in series between a lead of the inductor and a ground node, and
wherein the first capacitor and the first resistor are coupled together in series between the lead of the inductor and the ground node.

19. A method comprising:
receiving a digital control signal;
controlling at least one of a capacitance of a first capacitor or a resistance of a first resistor based on the digital control signal; and
setting, based on said controlling, an output impedance of a driver amplifier at an output node using a programmable output impedance adjustment circuit (POIAC) including an inductor, the first capacitor, and the first resistor, wherein the inductor and first capacitor are coupled together in series,
wherein the POIAC is integrated onto an integrated circuit along with the driver amplifier and is coupled to the output node.

20. The method of claim 19, further comprising:
receiving a multi-bit digital value with at least one of a plurality of conductors,
wherein the multi-bit digital value at least in part determines a magnitude of the output impedance.

21. The method of claim 20, wherein the multi-bit digital value is indicative of at least one of a plurality of power settings.

22. The method of claim 20, wherein the multi-bit digital value is indicative of at least one of a plurality of communication bands.

23. The method of claim 19, further comprising:
outputting digital information from a process detector to the POIAC,
wherein the digital information at least in part determines a magnitude of the output impedance.

24. A method comprising:
setting an output impedance of a driver amplifier at an output node using at least an inductor and a capacitor coupled together in series,
wherein the inductor has an inductance of L in units of henrys,
wherein the capacitor is a digitally-controlled capacitor that has a capacitance of C in units of farads,
wherein the ratio of L/C is more than fifty, and
wherein the inductor and the capacitor are integrated onto an integrated circuit along with the driver amplifier and coupled to the output node; and
receiving an analog voltage signal with at least one conductor,
wherein the analog voltage signal at least in part determines a magnitude of the output impedance.

25. A method comprising:
using an inductor and a capacitor coupled together in series such that the inductor and the capacitor are adapted to set an output impedance of an output node of a driver amplifier and are coupled to the output node,
wherein the inductor has an inductance of L in units of henrys,
wherein the capacitor is a digitally-controlled capacitor that has a capacitance of C in units of farads, wherein the ratio of L/C is more than fifty, and
wherein the driver amplifier, the inductor and the capacitor are integrated onto an integrated circuit.

26. A method comprising:
setting an output impedance of an output mode of a driver amplifier using an inductor and a capacitor coupled together in series and coupled to the output node,
wherein the inductor has an inductance of L in units of henrys,
wherein the capacitor is a digitally-controlled capacitor that has a capacitance of C in units of farads, wherein the ratio of L/C is more than fifty, and
wherein the driver amplifier, the inductor and the capacitor are integrated onto an integrated circuit; and
impedance matching at an input node of a power amplifier integrated circuit,
wherein the driver amplifier output node is coupled to the input node of the power amplifier integrated circuit through a matching network.

27. An integrated circuit comprising:
a driver amplifier having an output node and adapted to supply a signal onto the output node; and
means for providing programmable adjustment of an output impedance of the output node,
wherein the means is configured to receive a multi-bit digital power setting value and a multi-bit digital communication frequency band value,
wherein the multi-bit digital power setting value and the multi-bit digital communication frequency band value at least in part determine the output impedance.

28. The circuit of claim 27, wherein the means includes:
means for providing an inductance L in series with a capacitance C,
and wherein the ratio of L/C is more than fifty for the L in units of henrys and the C in units of farads.

29. A non-transitory computer-readable medium having processor-executable instructions stored thereon, wherein the processor-executable instructions comprise:
(a) communicating digital information to a programmable output impedance adjustment circuit (POIAC) coupled to an output node of an amplifier,
wherein the digital information includes a multi-bit digital power setting value and a multi-bit digital communication frequency band value; and
(b) determining an output impedance of the output node based at least in part on the digital information.

30. The non-transitory computer-readable medium of claim 29,
wherein the POIAC includes an inductor, a capacitor, and a resistor, wherein the inductor and capacitor are coupled together in series,
wherein the inductor has an inductance of L in units of henrys, wherein the capacitor has a capacitance of C in units of farads, wherein the ratio of L/C is more than fifty,
wherein the non-transitory computer-readable medium is a part of a first integrated circuit, and wherein the POIAC is a part of a second integrated circuit, and wherein the digital information is communicated in (a) from the first integrated circuit to the second integrated circuit.

* * * * *